United States Patent
Zhong et al.

(10) Patent No.: US 9,048,286 B2
(45) Date of Patent: Jun. 2, 2015

(54) SUBSTRATE FOR INTEGRATED CIRCUIT AND METHOD FOR FORMING THE SAME

(75) Inventors: Huicai Zhong, Beijing (CN); Qingqing Liang, Beijing (CN); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/159,351

(22) Filed: Jun. 13, 2011

(65) Prior Publication Data
US 2012/0132923 A1 May 31, 2012

Related U.S. Application Data

(63) Continuation of application No. PCT/CN2011/000309, filed on Feb. 25, 2011.

(30) Foreign Application Priority Data

Nov. 30, 2010 (CN) .......................... 2010 1 0574562

(51) Int. Cl.
*H01L 21/76* (2006.01)
*H01L 21/762* (2006.01)

(52) U.S. Cl.
CPC ...... *H01L 21/76232* (2013.01); *H01L 21/7624* (2013.01); *H01L 21/76283* (2013.01)

(58) Field of Classification Search
USPC .............. 257/247, 77, 76, E29.084, E29.089, 257/E21.54; 438/425
See application file for complete search history.

(56) References Cited

U.S. PATENT DOCUMENTS

| 5,877,067 A * | 3/1999 | Kimura et al. ................. 438/430 |
| 7,385,257 B2 | 6/2008 | Ieong et al. .................... 257/369 |
| 2005/0253194 A1* | 11/2005 | Yang et al. ..................... 257/347 |
| 2007/0158701 A1* | 7/2007 | Chang et al. ................... 257/288 |
| 2008/0048298 A1* | 2/2008 | Taylor et al. ................... 257/618 |
| 2008/0070373 A1* | 3/2008 | Huang ........................... 438/386 |
| 2009/0230404 A1* | 9/2009 | Masuda et al. .................. 257/77 |

FOREIGN PATENT DOCUMENTS

| CN | 101017834 A | 8/2007 | .............. H01L 21/12 |
| CN | 101064319 A | 10/2007 | .............. H01L 27/12 |
| CN | 101506964 A | 12/2009 | ............ H01L 21/762 |
| CN | 101996922 A | 3/2011 | ............ H01L 21/762 |

* cited by examiner

*Primary Examiner* — Robert Bachner
(74) *Attorney, Agent, or Firm* — Martine Penilla Group, LLP (57) ABSTRACT

The present invention relates to substrates for ICs and method for forming the same. The method comprises the steps of: forming a hard mask layer on the bulk silicon material; etching the hard mask layer and the bulk silicon material to form a first part for shallow trench isolation of at least one trench; forming a dielectric film on the sidewall of the at least one trench; further etching the bulk silicon material to deepen the at least one trench so as to form a second part of the at least one trench; completely oxidizing or nitridizing parts of the bulk silicon material which are between the second parts of the trenches, and parts of the bulk silicon material which are between the second parts of the trenches and side surfaces of the bulk silicon substrate; filling dielectric materials in the first and second parts of the at least one trench; and removing the hard mask layer.

8 Claims, 9 Drawing Sheets

(Prior Art)

SUBSTRATE FOR INTEGRATED CIRCUIT AND METHOD FOR FORMING THE SAME

CLAIM OF PRIORITY

This application claims priority under 35 U.S.C. §§120 and 365(c) as a continuation application of prior International Application No. PCT/CN2011/000309, filed Feb. 25, 2011, and which was not published in English under PCT Article 21(2). The PCT/CN2011/000309 application in turn claims priority to Chinese Application No. CN 201010574562.9, filed on Nov. 30, 2010. The disclosures of the prior international application and Chinese application are incorporated herein by reference.

FIELD OF THE INVENTION

The present invention relates to the field of integrated circuit manufacturing, and particularly, to a substrate for an Integrated Circuit (IC) and a method for manufacturing the same.

BACKGROUND OF THE INVENTION

Figure 6:
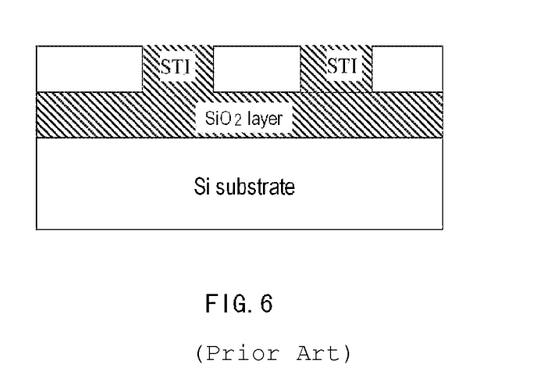
FIG. 6 schematically shows a structure in which STIs are formed in an SOI substrate.

In the process for manufacturing integrated circuits, SOI (silicon on insulator) substrate is usually used in conjunction with STI (shallow trench isolation) to achieve complete isolation between devices. FIGS. 4a-d show a method for manufacturing an SOI substrate in the prior art. In the method, silicon wafers are used to manufacture the SOI substrate, and two silicon wafers are needed for forming each SOI substrate. FIGS. 5a-d show another method for manufacturing an SOI substrate which improves the utilization efficiency of silicon wafer by using Smart Cut technology. FIG. 6 shows that STIs are formed in an SOI substrate in order to achieve complete isolation between devices. The methods for forming SOI substrate in the prior art are very complicated and expensive because a large number of silicon wafers are used, which significantly limits wide application of SOI substrates in IC industry. Therefore, a technique is needed to replace the methods for forming SOI substrate in the prior art so as to simplify process and reduce costs.

SUMMARY OF THE INVENTION

The object of the present invention is to provide a novel method for manufacturing a substrate for an integrated circuit. The present invention achieves the same effect of isolation between devices as that on SOI substrates by introducing original process flow for STI formation on bulk material.

As compared to the prior art, the present invention reduces costs by using cheap bulk material. And the method for forming the substrate according to the present invention is based on the process flow of STI, which significantly simplifies the process required for achieving complete isolation between devices.

A method for manufacturing a substrate according to the present invention comprises the steps of: forming a hard mask layer on the bulk silicon material; etching the hard mask layer and the bulk silicon material to form a first part for shallow trench isolation of at least one trench; forming a dielectric film on the sidewall of the at least one trench, further etching the bulk silicon material to deepen the at least one trench so as to form a second part of the at least one trench; completely oxidizing or nitridizing parts of the bulk silicon material which are between the second parts of the trenches, and parts of the bulk silicon material which are between the second parts of the trenches and side surfaces of the bulk silicon substrate; filling dielectric materials in the first and second parts of the at least one trench; and removing the hard mask layer.

Another method for manufacturing a substrate according to the present invention comprises the steps of: forming a hard mask layer on a bulk silicon material on which a GaN layer or an SiC layer has been formed; etching the hard mask layer and the GaN layer or SiC layer to form a first part of at least one trench, wherein the first part extends throughout the GaN layer or SiC layer for achieving shallow trench isolation; forming a dielectric film on the sidewall of the at least one trench; further etching the bulk silicon material to deepen the at least one trench so as to form a second part of the at least one trench; completely oxidizing or nitridizing parts of the bulk silicon material between the second parts of the trenches and between the second parts of the trenches and the side surfaces of the bulk silicon material; filling dielectric materials in the first and second parts of the at least one trench; and removing the hard mask layer.

Still another method for manufacturing a substrate according to the present invention comprises the steps of: forming a hard mask layer on a bulk semiconductor material; etching the hard mask layer and the bulk semiconductor material to form a first part for shallow trench isolation of at least one trench; forming a dielectric film on the sidewall of the at least one trench; further etching the bulk silicon material to deepen the at least one trench so as to form a second part of the at least one trench; completely insulating parts of the bulk semiconductor material between the second parts and between the second parts and the side surfaces of the bulk semiconductor material; filling dielectric materials in the first and second parts of the at least one trench; and removing the hard mask layer.

The present invention also provides a substrate for an integrated circuit, the substrate comprising: a bulk semiconductor material substrate; a dielectric layer on the bulk semiconductor material substrate; a semiconductor layer on the dielectric layer, the semiconductor layer being formed of the same material as that of the bulk semiconductor material substrate; and at least one trench, each of which has a first part in the semiconductor layer for forming shallow trench isolation and a second part being in the dielectric layer and extending throughout the dielectric layer, wherein the dielectric layer is formed by oxidizing or nitridizing a part of the bulk semiconductor material substrate; and the first and second parts of the at least one trench are filled with the same dielectric material which is different from the dielectric material of the dielectric layer.

Another substrate according to the present invention comprises: a bulk silicon substrate; a dielectric layer on the bulk silicon substrate; a semiconductor layer on the dielectric layer, wherein the semiconductor layer is formed of SiC or GaN; at least one trench, each of which has a first part extending throughout the semiconductor layer for forming shallow trench isolation and a second part being in the dielectric layer and extending throughout the dielectric layer. The dielectric layer is formed by oxidizing or nitridizing a part of the bulk silicon substrate; and wherein the first and second parts of the at least one trench are filled with the same dielectric material which is different from the material for forming the dielectric layer.

BRIEF DESCRIPTION OF THE DRAWINGS

FIGS. 4a-d show a method for forming an SOI substrate in prior art, wherein

FIGS. 5a-d show another method for forming an SOI substrate in prior art, wherein

DETAILED DESCRIPTION OF THE INVENTION

The present invention will be described in a greater detail below by referring to the drawings in combination with the embodiments so that the technical solutions provided by the present invention will be clear and apparent. The drawings are drawn schematically and not to scale. The same reference numbers are used to indicate same components throughout the drawings.

Figure 1A:
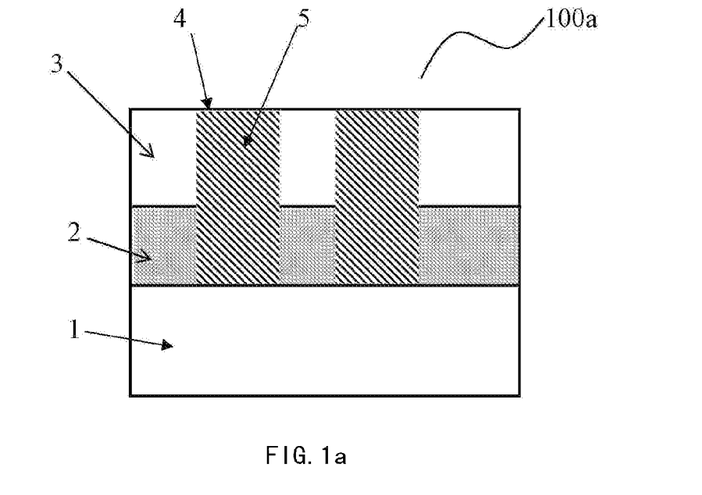
FIGS. 1a-d are schematic diagrams showing the substrates according to different embodiments of the present invention.
Figure 1B:
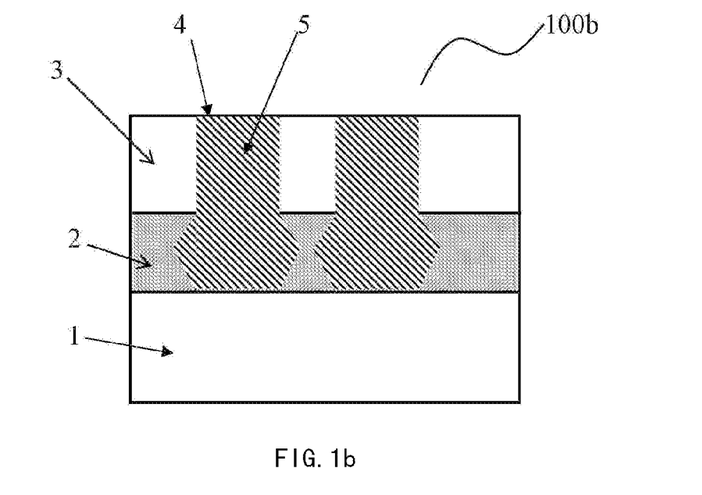

FIG. 1a and FIG. 1b respectively show cross-section views of the substrates according to the embodiments of the present invention. As shown in FIG. 1a, a substrate 100a comprises a bulk semiconductor material substrate 1, a dielectric layer 2 on the bulk semiconductor material substrate 1, and a first semiconductor layer 3 on the dielectric layer 2, wherein the dielectric layer 2 is formed by oxidizing or nitridizing part of the whole bulk semiconductor material substrate 1. The substrate 100a further comprises trenches 4 that have first parts in the bulk semiconductor substrate 1 (including the dielectric layer 2 which is formed from the bulk semiconductor material substrate 1 by oxidizing or nitridizing) and second parts in the dielectric layer 2. The parts of the first semiconductor layer 3 between the trenches 4 are the regions in which devices are to be formed. The trenches 4 are filled with a dielectric material 5 that is different from the material of the dielectric layer 2. The first semiconductor layer 3 is formed of a material which is the same as that of the bulk semiconductor substrate 1, for example, Si or GaN, etc. In the case that Si material is used, the dielectric layer 2 is, for example, silicon oxide or silicon nitride, and the dielectric material 5 can be, for example, formed of silicon oxide, silicon nitride, stressed silicon nitride or any combination thereof. The first part of the trench 4 has a depth of 10 nm-1000 nm, and the second part of the trench 4 has a depth of 10 nm-100 nm.

FIG. 1b shows a substrate 100b according to another embodiment of the present invention, which is the same as the substrate 100a above mentioned except that the sidewall of the second part of the trench 4 has a shape of "Σ".

Figure 1C:
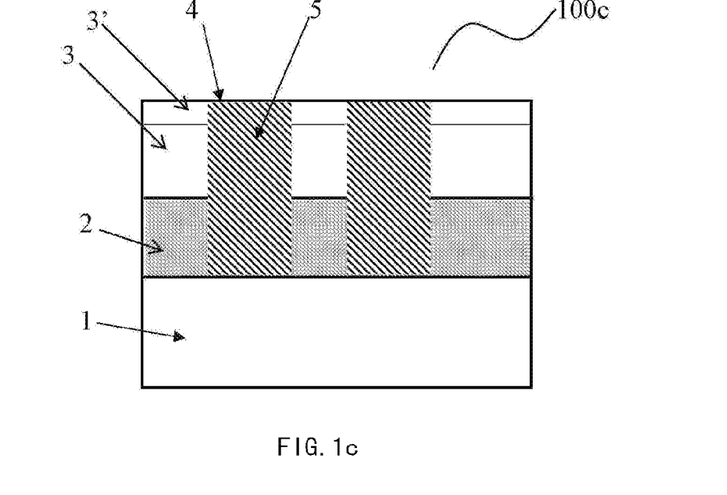
Figure 1D:
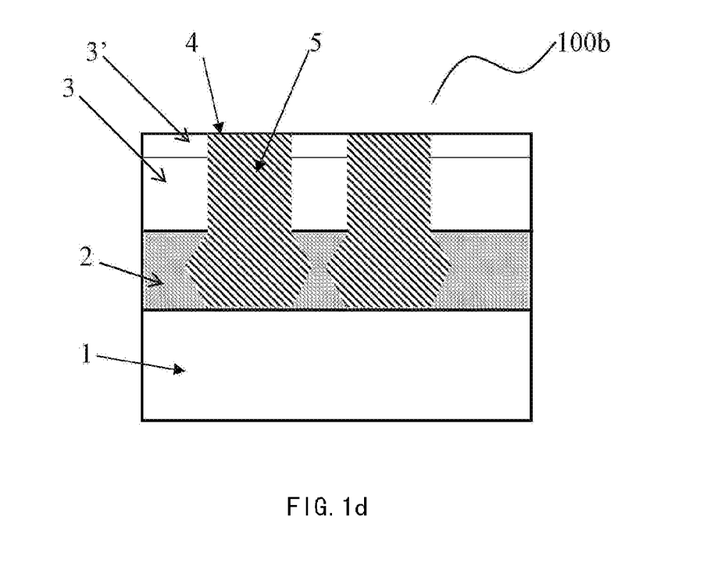

FIG. 1c shows a substrate 100c according to yet another embodiment of the present invention, which is the same as the substrate shown in FIG. 1a except that there is a second semiconductor layer 3' on the first semiconductor layer 3. The second semiconductor layer 3' can be formed of SiGe, GaAs, GaAlN, GaN, SiC or group III-V ternary mixed crystal semiconductor (for example, $Ga_xIn_{1-x}As$, $Al_xIn_{1-x}Sb$, etc.) to be used for forming devices based on these materials. Similarly, the present invention further provides another substrate 100d, as shown in FIG. 1d. The substrate 100d is the same as the substrate shown in FIG. 1b except that there is a second semiconductor layer 3' (which may be a GaN layer or a SiC layer) on the first semiconductor layer 3. Although there is a second semiconductor layer 3' formed of, for example, a GaN or SiC layer on the first semiconductor layer 3 in FIGS. 1c and 1d, in practice, the entire first semiconductor layer 3 may be substituted by the second semiconductor layer 3'.

FIGS. 2a-h are the top views showing the process for manufacturing a substrate for an IC according to an embodiment of the present invention. FIGS. 3a-h are the schematic diagrams showing the cross sections taken along the line AA' in FIGS. 2a-h, respectively.

Figure 2A:
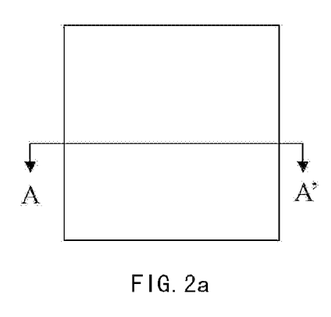
FIGS. 2a-h are top views showing the process for manufacturing a substrate for an IC according to an embodiment of the present invention.
Figure 3A:
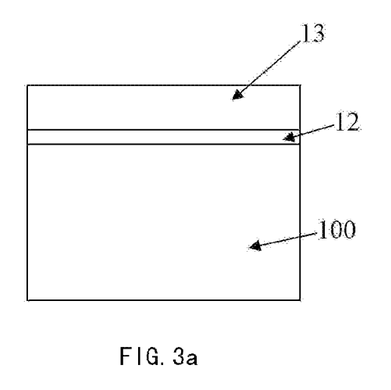
FIGS. 3a-h are schematic diagrams showing the cross sections taken along the line AA' in FIGS. 2a-h, respectively.

Firstly, a first hard mask layer 12 and a second hard mask layer 13 are formed on a bulk silicon substrate 100, as shown in FIGS. 2a and 3a. The first hard mask layer 12 may be formed of $SiO_2$, and the second hard mask layer 13 may be formed of $Si_3N_4$. The number and the material of the hard mask layers is not limited to the case as described above, and one skilled in the art may select a suitable number of layers and materials as required. In addition, although the bulk silicon substrate 100 is shown to be in a shape of square in FIG. 2a, it would be appreciated that the shape of the substrate 100 is not limited thereto and may be of arbitrary shapes.

Figure 2B:
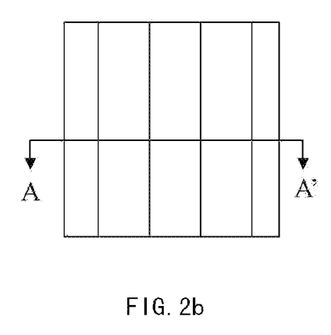
Figure 3B:
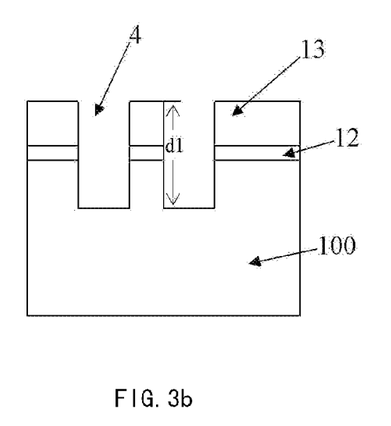

Next, the first parts of the trenches 4 for shallow trench isolation are formed in the substrate 100 by photolithography patterning followed dry or wet etching, as shown in FIGS. 2b and 3b. The first part may have a depth d1 of 10-1000 nm. Although in the illustrated embodiment, the sidewalls of the trenches 4 are perpendicular to the top surface of the substrate, the sidewalls of the trenches 4 may slightly slope in other embodiments. In addition, the number of the trenches 4 is not limited and can be arbitrary number as required.

Figure 2C:
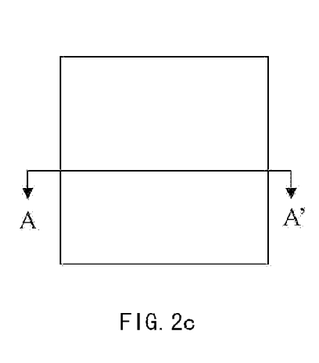
Figure 2D:
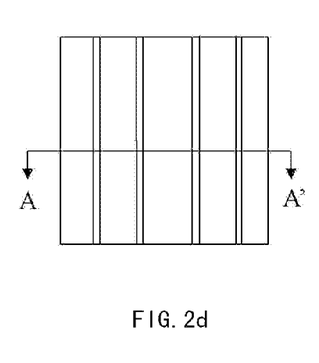
Figure 2E:
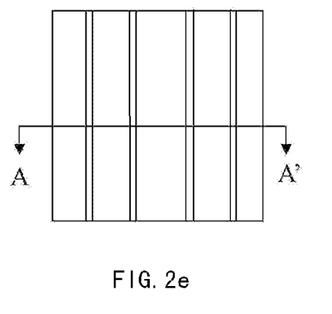
Figure 3C:
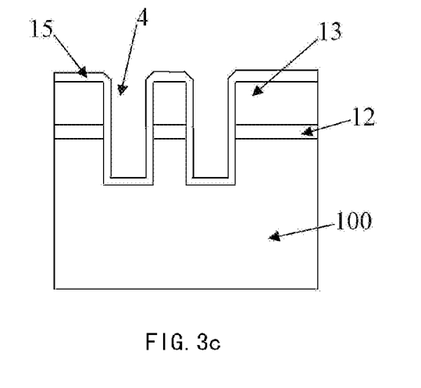
Figure 3D:
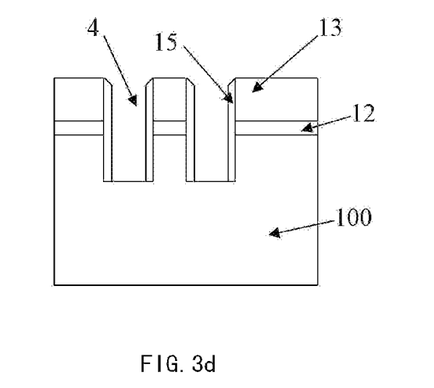

Then, a dielectric thin film 15 of, for example, $SiO_2$ or $Si_3N_4$ is deposited conformally on the sidewalls of the trenches 4, on the exposed surface of the substrate and on the second hard mask layer 13, as shown in FIGS. 2c and 3c. The portions of the dielectric thin film 15 on bottom of the trenches 4 and on the second hard mask layer 13 are removed by selective dry etching with the dielectric thin film 15 remained only on the sidewalls of the trenches 4 (as shown in FIGS. 2d and 3d). However, the present invention is not limited thereto, and in practice, it is only necessary to remove the dielectric thin film 15 on bottom of the trenches 4 with the dielectric thin film 15 on sidewalls of the trenches 4 remaining. The thin dielectric film 15 may have a thickness of 3-50 nm.

Figure 3E:
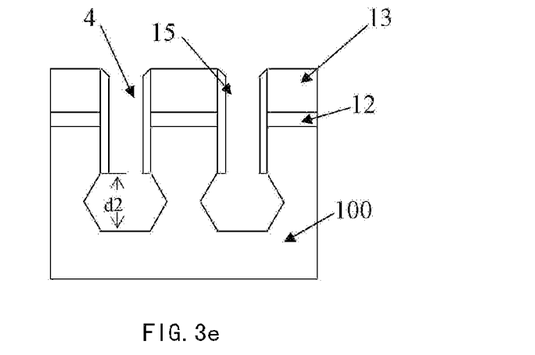

Afterwards, the trenches 4 can be deepened by using dry or wet etching to further etch the bulk silicon substrate 100. As a result, the second parts of the trenches 4 are formed to have a depth d2 of 10 nm-1000 nm. The second parts may have any shape as required. For example, in a preferred embodiment, selective wet chemical etching is adopted and the sidewalls of the formed second parts have a shape of "Σ", as shown in FIG. 3e. The advantage of forming such "Σ" shaped sidewalls is that the semiconductor material between the second parts of the trenches and between the second parts of the trenches and the side surfaces of the bulk semiconductor material can be oxidized or nitridized more easily in the following processing steps. Of course, the sidewalls of the second parts may also be perpendicular to the top surface of the substrate or have a slight slope. The etching may be isotropic or anisotropic depending on the shape of the second parts.

The formation of the "Σ" shaped trench may be as follows, as for a substrate with crystal orientation of <100>, the etched sidewalls along the {111} crystal plane will be obtained by etching using etchant such as TMAH or KOH.

Figure 2F:
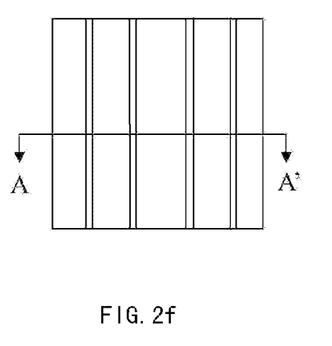
Figure 2G:
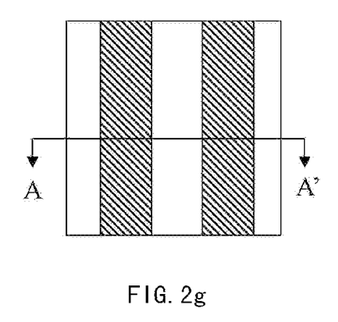
Figure 2H:
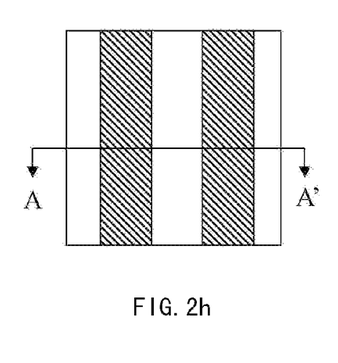
Figure 3F:
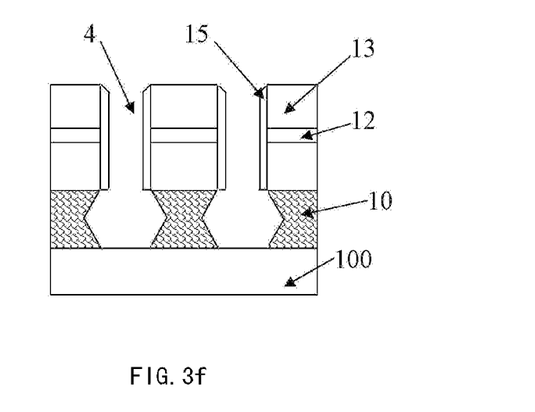

In the following, further process steps will be described by taking the second parts of "Σ" shape as an example. As shown in FIGS. 2f and 3f, high or low temperature oxidation, or high or low temperature nitridation of the substrate is performed so as to completely oxidize or nitridize the portions 10 of the bulk silicon substrate 100 below the regions 17 in which devices are to be formed. In other words, the portions 10 of the bulk silicon substrate are formed as silicon oxide or silicon nitride. The oxidation or nitridation can be achieved by plasma or the normal oxidation process. Although the procedure of oxidation or nitridation is described as an example, one skilled in the art may select any suitable process according to the material of the substrate 100 to achieve complete insulation of the substrate material below the regions 17 in which devices are to be formed.

Figure 3G:
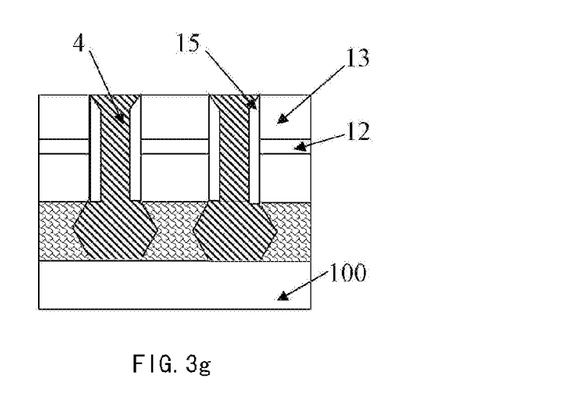

Then dielectric materials are filled in the first and second parts of the trenches 4, the materials can be such as silicon oxide, silicon nitride, stressed silicon nitride, etc. or any combination thereof. A Chemical Mechanical Planarization (CMP) process is performed to planarize the surface after filling the dielectric materials, and the structure as shown in FIG. 3g is obtained. As an alternative embodiment, the dielectric thin film 15 on the sidewalls of the trenches 4 may be removed by dry or wet etching before filling the dielectric materials.

Figure 3H:
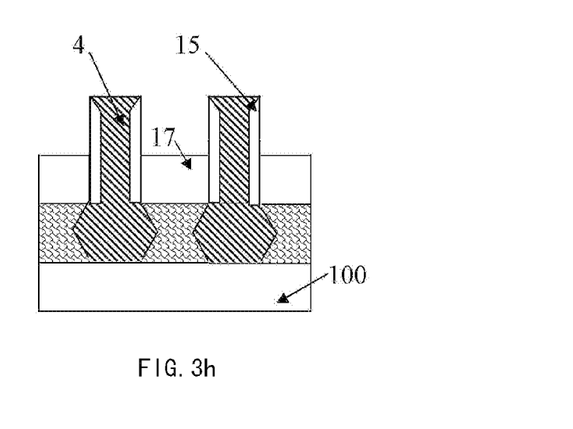
Figure 4A:
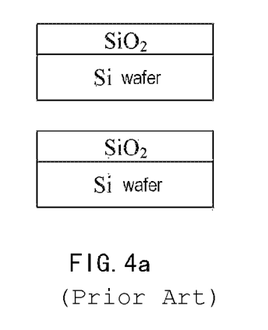
FIG. 4a shows that two silicon wafers are oxidized.
Figure 4B:
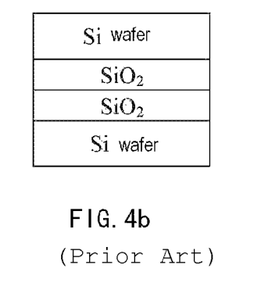
FIG. 4b shows that the two oxidized silicon wafers are bonded together.
Figure 4C:
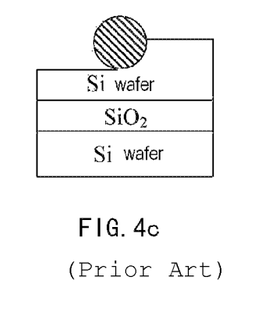
FIG. 4c shows that the upper silicon wafer is grinded.
Figure 4D:
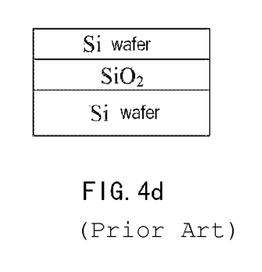
FIG. 4d shows the SOI substrate completed through annealing and polishing.
Figure 5A:
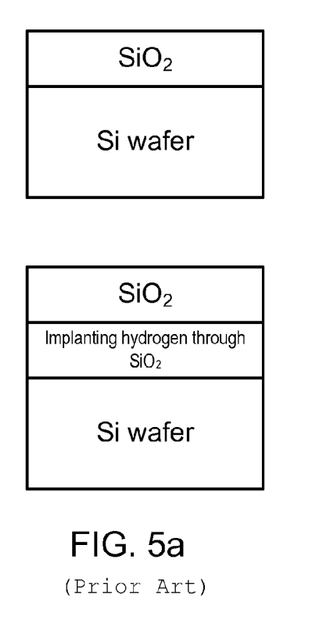
FIG. 5a shows that two silicon wafers are oxidized.
Figure 5B:
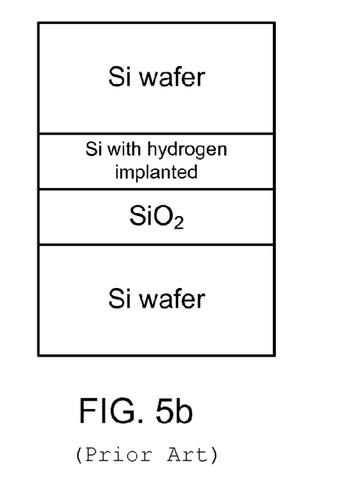
FIG. 5b shows that the two oxidized silicon wafers are bonded together.
Figure 5C:
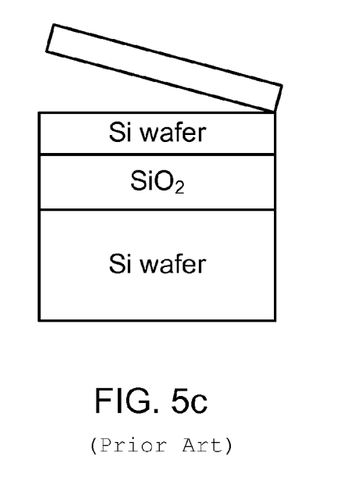
FIG. 5c shows that a part of the upper silicon wafer is cut by using Smart Cut technology so as to be used for manufacturing another SOI substrate.
Figure 5D:
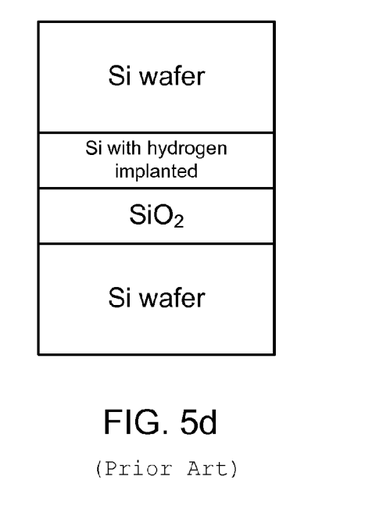
FIG. 5d shows the SOI substrate completed through annealing and polishing.

Finally, the first hard mask layer 12 and the second hard mask layer 13 are removed and the substrate as shown in FIG. 3h is obtained. Then, desired devices may be formed in the regions 17 as required.

The method for forming the substrate according to the present invention is described in conjunction with bulk silicon material hereinabove. However, the present invention is not limited to be applied to bulk silicon material and can also be applied to the IC manufacture process using other semiconductor materials (for example, SiGe, GaAs, GaAlN, GaN, SiC, or group III-V ternary mixed crystal semiconductor such as $Ga_xIn_{1-x}As$, $Al_xIn_{1-x}Sb$, etc.). For example, the silicon bulk material mentioned above may be substituted by the GaN bulk material. Alternatively, for example, a further semiconductor layer, formed of such as SiGe, GaAs, GaAlN, GaN, SiC, or group III-V ternary mixed crystal semiconductor (for example, $Ga_xIn_{1-x}As$, $Al_xIn_{1-x}Sb$), is formed on the bulk silicon substrate 100 firstly, and then the processes as shown in FIGS. 3a-3h are performed. That is, the hard mask layers 12 and 13 are formed on the further semiconductor layer in the step as shown in FIG. 3a, and the hard mask layers 12 and 13, the further semiconductor layer and the bulk silicon substrate are etched in the step as shown in FIG. 3b so as to form the first parts of the trenches 4. The subsequent processing steps are the same as those as shown in FIGS. 3c-3h and will not be elaborated here. It is to be noted that in the step as shown in FIG. 3b, the bulk silicon substrate is not necessarily to be etched. In other words, the first parts of the trenches 4 may only extend throughout the further semiconductor layer, and may not necessarily extend into the bulk silicon substrate 100.

Moreover, the integrated circuit in the sense of the present invention also comprises optoelectronic integrated circuits including photoelectric devices such as light emitting diode.

The transistor and the method for forming the same according to the present invention are described by illustrative embodiments hereinbefore. However, the scope of the present invention does not intend to be limited thereto. Any modifications or variations of the above embodiments that can be contemplated by one skilled in the art will fall within the scope of the present invention defined by the appended claims.

The invention claimed is:

1. A method for manufacturing a substrate, comprising the steps of:
    forming a hard mask layer on a bulk silicon material;
    etching the hard mask layer and the bulk silicon material to form a first part for shallow trench isolation of at least one trench;
    forming a dielectric film on the sidewall of the at least one trench,
    further etching the bulk silicon material to deepen the at least one trench so as to form a second part of the at least one trench;
    completely nitridizing only parts of the bulk silicon material which are between the second parts of the trenches, and only parts of the bulk silicon material which are between the second parts of the trenches and side surfaces of the bulk silicon substrate, thereby forming a first dielectric material;
    filling a second dielectric material different from the first dielectric material in the first and second parts of the at least one trench; and
    removing the hard mask layer.

2. The method according to claim 1, wherein a further semiconductor layer is formed on the bulk silicon material before forming the hard mask layer, and etching the hard mask layer and the bulk silicon material to form a first part of at least one trench further comprises etching the further semiconductor layer.

3. The method according to claim 2, wherein the further semiconductor layer is formed of SiGe, GaAs, GaAlN, GaN, SiC or group III-V ternary mixed crystal semiconductor.

4. The method according to claim 1, wherein the step of forming the dielectric film on the sidewall of the at least one trench comprises:
    conformally forming the dielectric film on the hard mask layer, the sidewall of the at least one trench, and the bottom of the at least one trench; and
    etching the dielectric film so that the dielectric film is only maintained on the sidewall of the at least one trench.

5. The method according to claim 1, wherein the dielectric film formed on the sidewall of the at least one trench is completely removed before filling the second dielectric material in the first and second parts of the at least one trench.

6. The method according to claim 1, the second part of the at least one trench are formed by selective wet chemical etching such that the sidewall of the second parts has a shape of "Σ".

7. The method according to claim 1, wherein the first part has a depth of 10 nm-1000 nm, and the second part has a depth of 10 nm-100 nm.

8. A method for manufacturing a substrate, comprising:
    forming a hard mask layer on a bulk silicon material on which a semiconductor layer has been formed, wherein the semiconductor layer is a layer of SiGe, GaAs, GaAlN, GaN, SiC or group III-V ternary mixed crystal semiconductor;
    etching the hard mask layer and the semiconductor layer to form a first part of at least one trench, wherein the first part extends throughout the semiconductor layer for achieving shallow trench isolation;
    forming a dielectric film on the sidewall of the at least one trench;

further etching the bulk silicon material to deepen the at least one trench so as to form a second part of the at least one trench;
completely nitridizing only parts of the bulk silicon material between the second parts of the trenches and between the second parts of the trenches and the side surfaces of the bulk silicon material, thereby forming a first dielectric material;
filling a second dielectric material different from the first dielectric material in the first and second parts of the at least one trench; and
removing the hard mask layer.

* * * * *